US010534265B2

(12) United States Patent
Kim

(10) Patent No.: US 10,534,265 B2
(45) Date of Patent: Jan. 14, 2020

(54) APPARATUS FOR TREATING SUBSTRATE AND METHOD FOR CLEANING GUIDE PLATE

(71) Applicant: SEMES CO., LTD., Chungcheongnam-do (KR)

(72) Inventor: Daesung Kim, Gyeonggi-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 317 days.

(21) Appl. No.: 15/363,276

(22) Filed: Nov. 29, 2016

(65) Prior Publication Data

US 2017/0151588 A1 Jun. 1, 2017

(30) Foreign Application Priority Data

Nov. 30, 2015 (KR) ........................ 10-2015-0168695

(51) Int. Cl.
| | | |
|---|---|---|
| H01L 21/68 | (2006.01) | |
| G03F 7/20 | (2006.01) | |
| G03F 7/16 | (2006.01) | |
| H01L 21/67 | (2006.01) | |
| H01L 21/687 | (2006.01) | |
| B08B 3/02 | (2006.01) | |

(52) U.S. Cl.
CPC ............... G03F 7/20 (2013.01); G03F 7/162 (2013.01); H01L 21/6715 (2013.01); H01L 21/67051 (2013.01); H01L 21/68735 (2013.01); B08B 3/02 (2013.01)

(58) Field of Classification Search
None
See application file for complete search history.

(56) References Cited

U.S. PATENT DOCUMENTS 5,312,487 A * 5/1994 Akimoto ............. H01L 21/6715
118/302
5,689,749 A * 11/1997 Tanaka ................... G03F 7/3021
396/611

FOREIGN PATENT DOCUMENTS

| JP | H09-117708 A | 5/1997 |
|---|---|---|
| JP | H10-258249 A | 9/1998 |
| KR | 10-2003-0010257 A | 2/2003 |
| KR | 10-2004-0013822 A | 2/2004 |
| KR | 10-0508753 B | 8/2005 |
| KR | 10-2007-0082450 A | 8/2007 |
| KR | 10-2012-0004921 A | 1/2012 |
| KR | 10-2014-0114296 A | 9/2014 |

* cited by examiner

*Primary Examiner* — Michael E Barr
*Assistant Examiner* — Jason P Riggleman
(74) *Attorney, Agent, or Firm* — Carter, DeLuca & Farrell LLP

(57) ABSTRACT

The present disclosure relates to an apparatus for treating a substrate. The apparatus for treating a substrate includes a cup having an inner space whose top is open, a supporting unit for supporting a substrate in the inner space, a guide plate provided to surround the supporting unit, a treatment solution supplying unit for supplying a treatment solution to an upper surface of the substrate supported by the supporting unit, and a cleaning solution supplying unit for supplying a cleaning solution to an upper surface of the guide plate.

14 Claims, 12 Drawing Sheets

APPARATUS FOR TREATING SUBSTRATE AND METHOD FOR CLEANING GUIDE PLATE

CROSS REFERENCE TO RELATED APPLICATIONS

A claim for priority under 35 U.S.C. § 119 is made to Korean Patent Application No. 10-2015-0168695 filed on Nov. 30, 2015 in the Korean Intellectual Property Office, the entire contents of which are hereby incorporated by reference.

BACKGROUND OF THE INVENTION

The present invention disclosed herein relates to an apparatus for treating a substrate and a method for cleaning a guide plate.

Variety processes such as cleaning, deposition, photolithography, etching, and ion injecting, etc. are performed in a manufacturing process of semiconductor device. The photolithography process sequentially performs a coating process, an exposure process, and a developing process. The coating process coats a surface of a substrate with a photoresist such as a resist. The exposure process exposes the substrate on which a photoresist film is formed with a reticle having a circuit pattern. The developing process removes an exposed area among photoresist.

FIG. 1 shows a conventional apparatus 10 for treating a substrate for performing a coating process. When the apparatus 10 rotates the substrate and coats the photoresist, the photoresist reaches to a guide plate 11 by centrifugal force and contaminates the guide plate 11. A photoresist 12 that reached the guide plate is exposed in air and rapidly solidified. Therefore, it is hard to clean the entire area of the guide plate 11 when cleaning the guide plate 11 after a photoresist coating process.

Also, when providing the photoresist in an upper surface of the guide plate 11, a cleaning solution flows along the upper surface of the guide plate 11. As moving down to a bottom side of the guide plate 11, a stream of the cleaning solution is dispersed into several parts and the cleaning solution does not run in an area between each of the streams and thereby the area is not cleaned.

Also, when cleaning the guide plate 11, the cleaning solution runs along a slope of the guide plate 11 and discharged, and thereby it is hard to reuse. Therefore, there is a problem of needing lots of cleaning solutions to clean the guide plate 11.

SUMMARY OF THE INVENTION

The present invention provides an apparatus for treating a substrate which is capable of cleaning a guide plate at the same time while solution coating process and a method for cleaning the guide plate.

The present invention provides an apparatus for treating a substrate which may reduce amount of a cleaning solution for cleaning a guide plate and a method for cleaning the guide plate.

The objects of the inventive concept are not limited hereinafter, and other objects thereof will be understandable by those skilled in the art from the following descriptions.

The present invention provides an apparatus for treating a substrate.

According to an embodiment of the present invention, the apparatus for treating a substrate comprises a cup having an inner space where a top is open, a supporting unit for supporting the substrate in the inner space, a guide plate provided to surround the supporting unit, a treatment solution supplying unit for supplying a treatment solution to an upper surface of the substrate supported by the supporting unit, and a cleaning solution supplying unit for supplying a cleaning solution to an upper surface of the guide plate.

According to an embodiment, a groove in which the cleaning solution may remain is formed in the upper surface of the guide plate.

According to an embodiment, the guide plate is provided to have an outer part inclined downwardly and outwardly.

According to an embodiment, the groove is provided with a ring shape in an inclined portion of the guide plate.

According to an embodiment, the guide plate is provided to have an outer part having a stair shape descending downwardly and outwardly.

According to an embodiment, the groove is provided with a ring shape at a horizontal plane of the guide plate.

According to an embodiment, the groove is provided with plural numbers of concentric rings having different diameters from each other.

According to an embodiment, the cup is provided with a exhaust space of the solution at a location facing an outer end of the guide plate and a exhaust line is connected to the exhaust space.

According to an embodiment, the apparatus for treating a substrate further comprises a controller for controlling the treatment solution supplying unit and the cleaning solution supplying unit, wherein the controller controls the treatment solution supplying unit and the cleaning solution supplying unit so that the cleaning solution is supplied while the treatment solution is supplied.

According to an embodiment, the treatment solution is a photoresist and the cleaning solution is a thinner.

According to an embodiment, the cleaning solution supplying unit supplies a cleaning solution directly to the upper surface of the guide plate.

According to an embodiment, an upper surface of the substrate is higher than the upper surface of the guide plate so that the cleaning solution flows to the upper surface of the guide plate by centrifugal force when the substrate rotates.

The present invention provides a method for cleaning a guide plate.

According to an embodiment of the present invention, a method for cleaning a guide plate comprises supplying a cleaning solution while a treatment solution is supplied.

According to an embodiment, the cleaning solution is directly supplied to the upper surface of the guide plate.

According to an embodiment, the cleaning solution is supplied to a bottom surface of the substrate while rotating the substrate so that the cleaning solution flows into the upper surface of the guide plate by centrifugal force.

According to an embodiment of the present invention, a guide plate may be cleaned while coating a photoresist before photoresist of the guide plate is solidified.

Also, according to an embodiment of the present invention, amount of the cleaning solution for cleaning the guide plate may be reduced.

The objects of the inventive concept are not limited to the above mentioned effects. Other objects thereof will be understandable by those skilled in the art from the following descriptions and the present application.

DETAILED DESCRIPTION

Various example embodiments will be described more fully hereinafter with reference to the accompanying drawings, in which some example embodiments are shown. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Therefore, features of the drawings are exaggerated to emphasize definite explanation.

An apparatus of an embodiment of the present inventive concept can be used to perform photolithography process on a substrate such as semiconductor wafer or flat display panel. Especially an apparatus for treating a substrate in accordance with an embodiment can be connected to an exposure apparatus and thus can be used to perform coating process and developing process on a substrate. As an exemplary, the exemplary embodiments of the present invention will be described with an apparatus for treating a semiconductor substrate.

Hereinafter an apparatus for treating a substrate will be described with reference to FIGS. 2 to 12.

Figure 1:
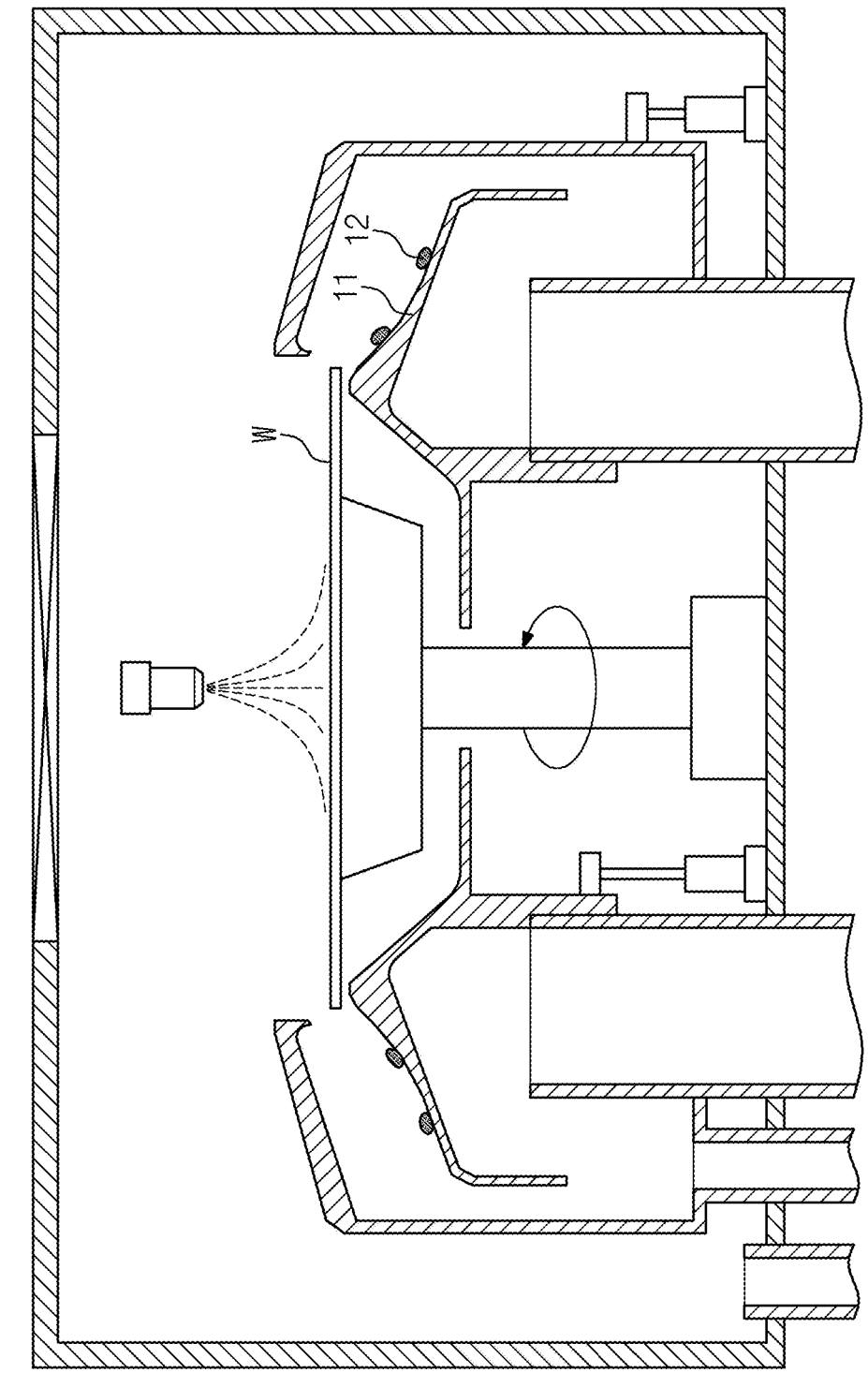
FIG. 1 shows a guide plate being contaminated in a conventional apparatus for treating a substrate.
Figure 2:
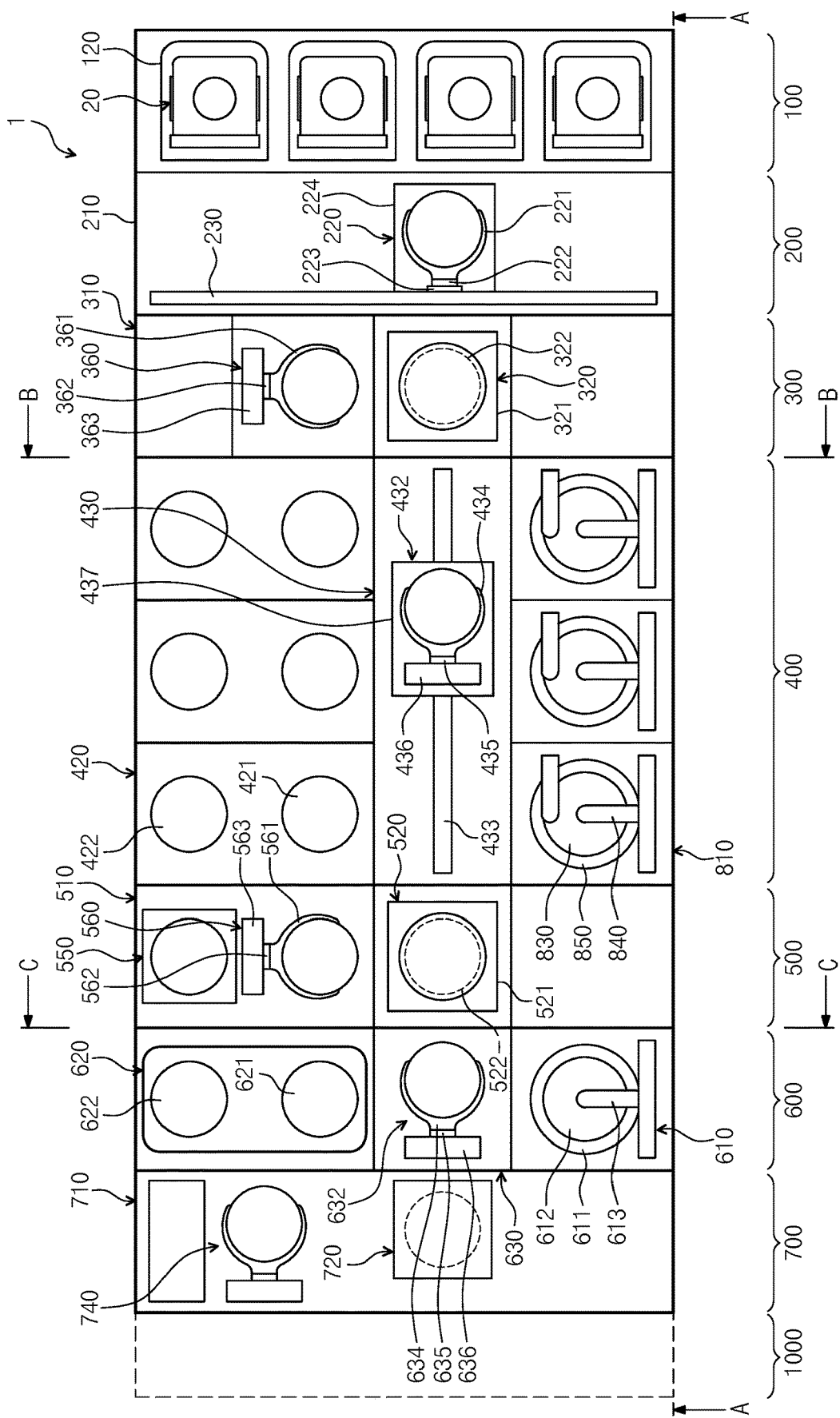
FIG. 2 is a plan view of an apparatus for treating a substrate in accordance with an embodiment of the present invention.
Figure 3:
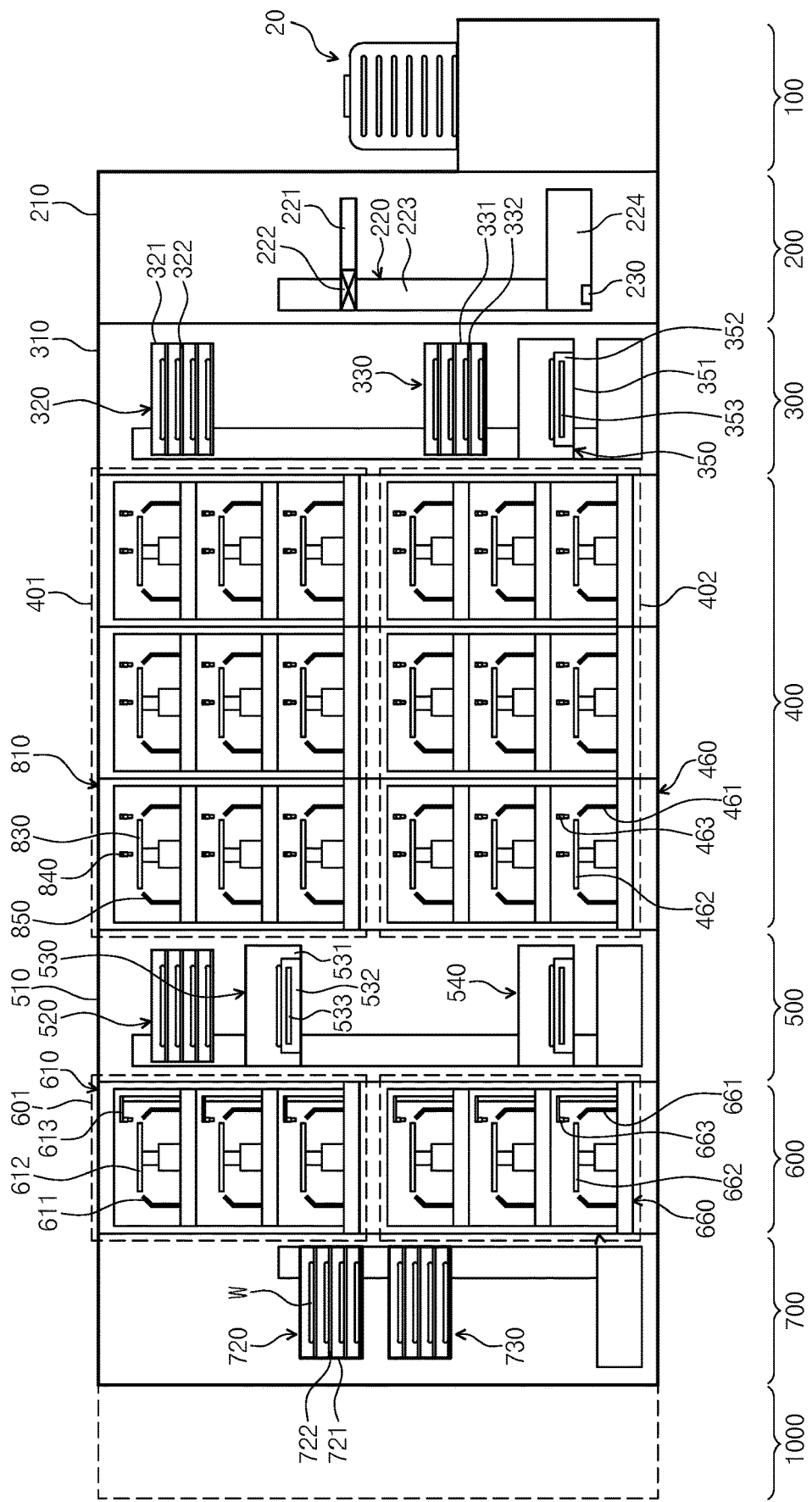
FIG. 3 is a cross sectional view of an apparatus of FIG. 2 taken from A-A direction.
Figure 4:
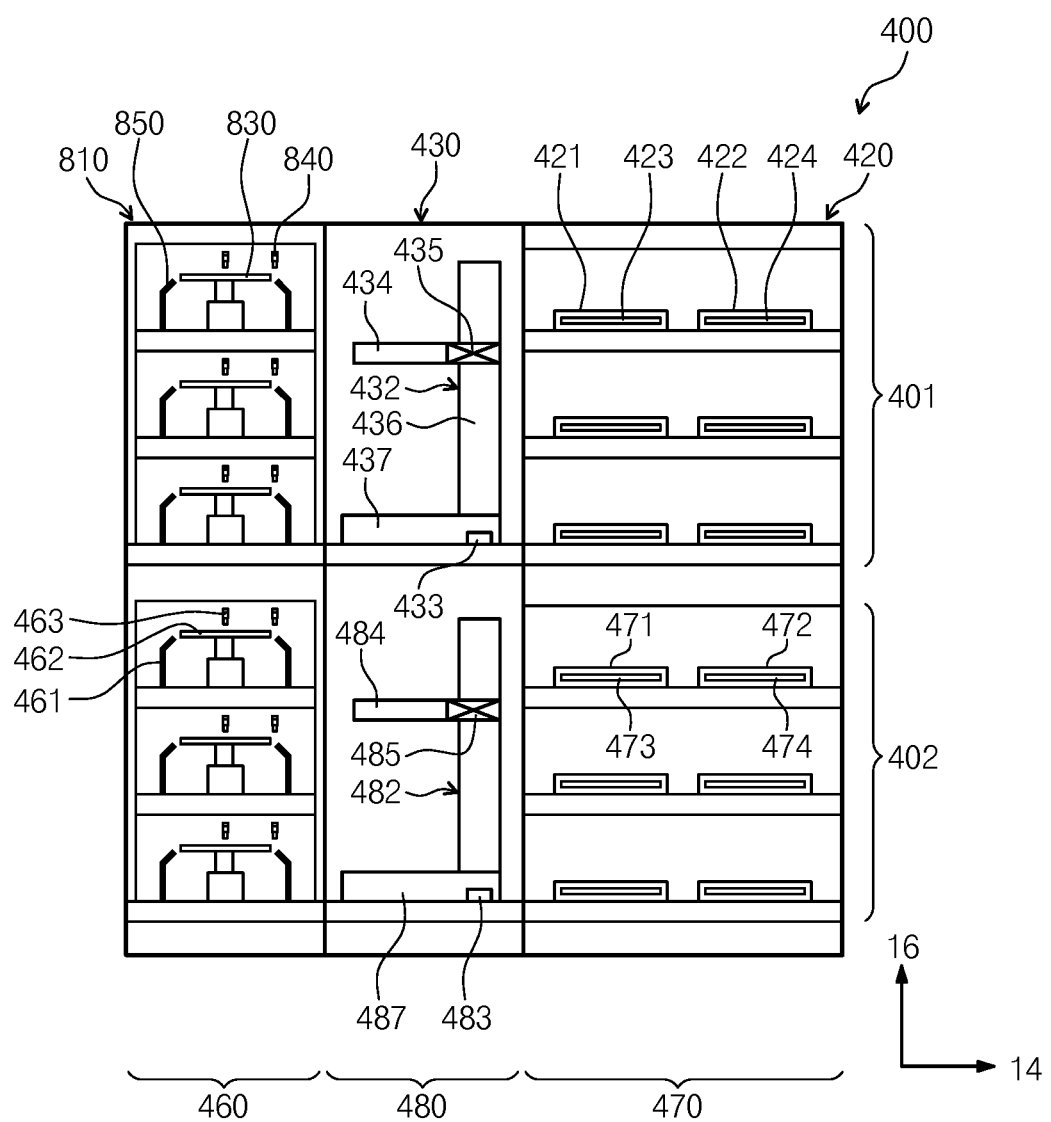
FIG. 4 is a cross sectional view of an apparatus of FIG. 2 taken from B-B direction.
Figure 5:
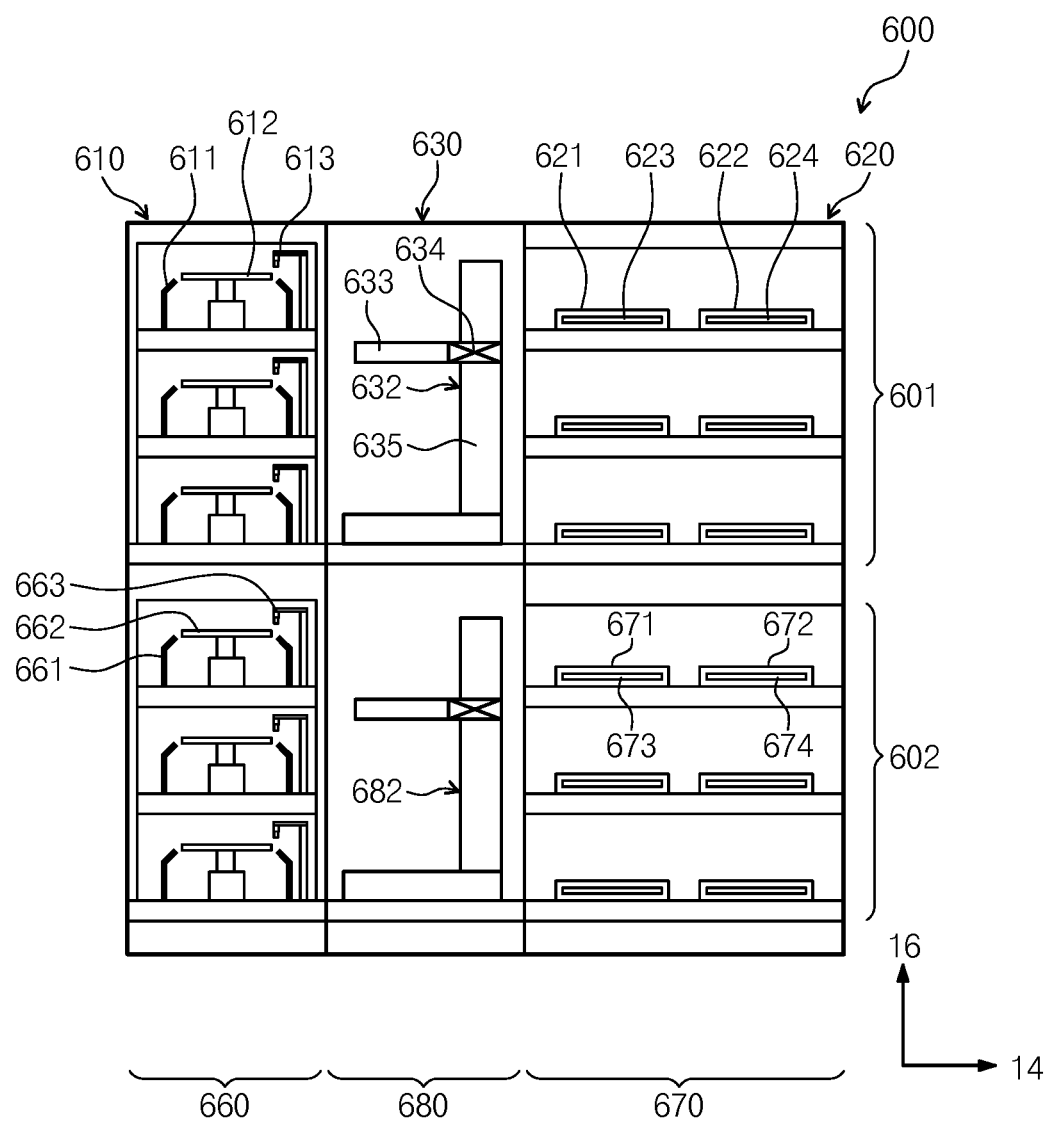
FIG. 5 is a cross sectional view of an apparatus of FIG. 2 taken from C-C direction.

FIG. 2 is a top plan view of the apparatus for treating a substrate in accordance with an example embodiment of the present invention, FIG. 3 is a cross-sectional view of the apparatus of FIG. 2 taken from A-A direction, FIG. 4 is a cross-sectional view of the apparatus of FIG. 2 taken from B-B direction, and FIG. 5 shows the apparatus of FIG. 2 viewed from C-C direction.

Referring to FIGS. 2-5, an apparatus 1 for treating a substrate comprises a load port 100, an index module 200, a first buffer module 300, a coating and developing module 400, a second buffer module 500, a pre/post exposure treating module 600, and an interface module 700. The load port 100, the index module 200, the first buffer module 300, the coating and developing module 400, the second buffer module 500, the pre/post exposure treating module 600, and the interface module 700 are sequentially arranged along one direction.

Hereinafter, a direction where the load port 100, the index module 200, the first buffer module 300, the coating and developing module 400, the second buffer module 500, the pre/post exposure treating module 600, and the interface module 700 are arranged will be referred to as a first direction 12, a direction that is perpendicular to the first direction when viewed from the top will be referred to as a second direction 14, and a direction perpendicular to each of the first direction 12 and the second direction 14 will be referred to as a third direction 16.

A substrate W moves as received within a cassette 20. The cassette 20 has a sealed structure from outside. In an example, as the cassette 20, a Front Open Unified Pod (FOUP) having a door in front thereof may be used.

The load port 100, the index module 200, the first buffer module 300, the coating and developing module 400, the second buffer module 500, the pre/post exposure treating module 600, and the interface module 700 will be described in detail below.

The load port 100 has a placement table 120 where it places a cassette 20 in which substrates W are received. The placement table 120 may be provided with plural numbers and the pluralities of placement tables 200 are arranged in a row along the second direction 14. FIG. 2 illustrates only four placement tables 120 as an example.

The index module 200 transfers substrate W between buffer module 300 and cassette 20 placed in the placement table 120 of the road port 100. The index module 200 includes a frame 210, an index robot 220, and a guide rail 230. The frame 210 is provided as rectangular shape where internal is generally empty, and placed in between the buffer module 300 and the load port 100. The frame 210 of the index module 200 may be provided having lower height than a frame 310 of the buffer module 300 which will be described later. The index robot 220 and the guide rail 230 are arranged within the frame 210. The index robot 220 is provided with a structure that may drive four axles so that a hand 221 directly handles the substrate W to move and rotate to the first direction 12, the second direction 14, and the third direction 16. The index robot 220 includes a hand 221, an arm 222, a supporter 223, and a pedestal 224. The hand 221 is fixedly installed on the arm 222. The arm 222 is provided as expandable and contractible structure and rotatable structure. The supporter 223 is arranged such that the lengthwise direction thereof is parallel with third direction. The arm 222 is movably connected to the supporter 223 such that the arm 22 moves along the supporter 223. The supporter 223 is fixedly connected to the pedestal 224. The guide rail 230 is arranged such that the lengthwise direction thereof is parallel with the second direction 14. The pedestal 224 is movably connected to the guide rail 230, moving linearly along the guide rail 230. Also, although it is not shown, the frame 210 is further provided with a door opener that opens and closes the cassette 20 door.

The first buffer module 300 includes a frame 310, a first buffer 320, a second buffer 330, a cooling chamber 350, and a first robot 360. The frame 310 is provided as a rectangular shape with empty internal, and is arranged between the index module 200 and the coating and developing module 400. The first buffer 320, the second buffer 330, the cooling chamber 350, and the first robot 360 are placed within the frame 310. The cooling chamber 350, the second buffer 330, and the first buffer 320 are sequentially arranged along the third direction 16 starting from a bottom. The first buffer 320 is located at a height corresponding to a height of the coating module 401 of the coating and developing module 400 which will be described later, and the second buffer 330 and the cooling chamber 350 are provided at a height corresponding to a height of the developing module 402 of the coating and developing module 400 which will be described later. The first buffer robot 360 is separately positioned with the second buffer 330, the cooling chamber 350, and the first buffer 320 along the second direction 14 with a certain distance.

Each of the first buffer 320 and the second buffer 330 temporarily keeps a plurality of substrates W. The second buffer 330 has a housing 331 and a plurality of supporters 332. The supporters 332 are placed within the housing 331, and are spaced apart from each other along with the third direction 16. One substrate W is placed on each supporter 332. The housing 331 has an opening (not shown) on the direction where the index robot 220 is provided, on the direction where the first robot 360 is provided, and on the direction where the developing robot 482 is provided such that the index robot 220, the first buffer robot 360, and a developing robot 482 of the developing module 402 which will be described later bring or take the substrates W in or out of the supporter 332 within the housing 331. The first buffer 320 generally has a similar structure to the second buffer 330. The difference is that in the first buffer 120, a housing 321 has an opening on the direction where the first buffer robot 360 is provided and on the direction where a coating robot 432 located on a coating module 401 is provided. The number of supporter 322 provided on the first buffer 320 and the number of supporter 332 on the second buffer 330 may be the same or different. According to an example embodiment, the number of supporter 332 provided on the second buffer 330 may be larger than the number of supporter 332 provided on the first buffer 320.

The first buffer robot 360 transfers the substrate W in between the first buffer 320 and the second buffer 330. The first buffer robot 360 includes a hand 361, an arm 362, and a supporter 363. The hand 361 is fixedly installed on the arm 362. The arm 362 is provided as expandable and contractible structure so that the hand 361 may move along the second direction 14. The arm 362 is movably connected to supporter 363 and moves linearly along the supporter 363 in the third direction 16. The supporter 363 may have a length extending from a point corresponding to the second buffer 330 and to a point corresponding to the first buffer 320. The supporter 363 may be provided longer than this extending upward or downward. The first buffer robot 360 may be provided such that the hand 361 has only two axle drive along the second direction 14 and the third direction 16.

The cooling chamber 350 cools each substrate W. The cooling chamber 350 includes a housing 350 and a cooling plate 352. The cooling plate 352 has an upper surface where the substrate W places and a cooling system 353 that cools the substrate W. The cooling system 353 utilizes various cooling methods such as cooling by water or cooling by thermoelectric element. Also, the cooling chamber 350 may be provided with a lift pin assembly that places the substrate W on a cooling plate 352. The housing 351 has an opening (not shown) on a direction where the index robot 220 is provided and on a direction where the developing robot 482 is provided such that the developing robot 482 provided on the index robot 220 and the developing module 402 bring or take the substrate W in or out of the cooling plate 352. Also, the cooling chamber 350 is provided with doors (not shown) that open and close the above-described opening.

The coating and developing module 400 performs a coating process that coats a photoresist on a substrate W before exposure process and a developing process that develops the substrate W after exposure process. Generally the coating and developing module 400 has a rectangular shape. The coating and developing module 400 has a coating module 401 and a developing module 402. The coating module 401 and the developing module 402 are arranged vertically as a separate layer. According to an example, the coating module 401 is placed on top of the developing module 402.

The coating module 401 includes a coating process that coats photoresist such as photoresist on a substrate W and a heat treatment process such as heating and cooling the substrate W before and after resist coating process. The coating module 401 includes a resist coating chamber 410, a bake chamber 420, and a transfer chamber 430. The resist coating chamber 410, the bake chamber 420, and the transfer chamber 430 are sequentially arranged along the second direction 14. Therefore, the coating chamber 410 and the bake chamber 420 are positioned separately each other along the second direction 14 with interposing the transporting chamber 430 there between. A plurality of the resist coating chambers 410 are provided along the first direction 12 and the third direction 16, respectively. In Figs., as an example, six resist coating chambers 410 are illustrated.

A plurality of bake chambers 420 are provided along the first direction 12 and the third direction 16, respectively. In Figs., as an example, six bake chambers 420 are illustrated. However, the number of the bake chamber 420 may greater than 6.

The transfer chamber 430 is placed in parallel with or in line with the first buffer 320 of the first buffer module 300 in the first direction 12. Within the transfer chamber 430, a coating unit robot 432 and a guide rail 433 are positioned. Generally the transfer chamber 430 has a rectangular shape. The coating unit robot 432 transfers the substrate W between bake chambers 420, resist coating chambers 400, the first buffer 320 of the first buffer module 300, and the first cooling chamber 520 of the second buffer module 500 which will be described later. The guide rail 433 is arranged such that its lengthwise direction is parallel with the first direction 12. The guide rail 433 guides the coating unit robot 432 to move linearly in the first direction 12. The coating unit robot 432 includes a hand 434, an arm 435, a supporter 436, and a pedestal 437. The hand 434 is fixedly installed on the arm 435. The arm 435 is provided as expandable and contractible structure, and thereby the hand 434 may move in horizontal direction. The supporter 436 is arranged such that the lengthwise direction thereof is parallel with the third direction 16. The arm 435 is connected to the supporter 436 so that the arm 435 may move linearly along the supporter 436 in the third direction 16. The supporter 436 is fixedly connected to the pedestal 437 and the pedestal 437 is connected to the guide rail 433 to move along the guide rail 433.

All resist coating chambers 410 have the same structures. Only sorts of photoresist used in each of resist coating chamber 410 may be different from each other. In an example, a chemical amplification resist may be used as a photoresist.

The resist coating chamber 410 is provided as an apparatus for treating a substrate for coating photoresist on a substrate W. A liquid coating process is performed in an apparatus 800 for treating a substrate.

Figure 6:
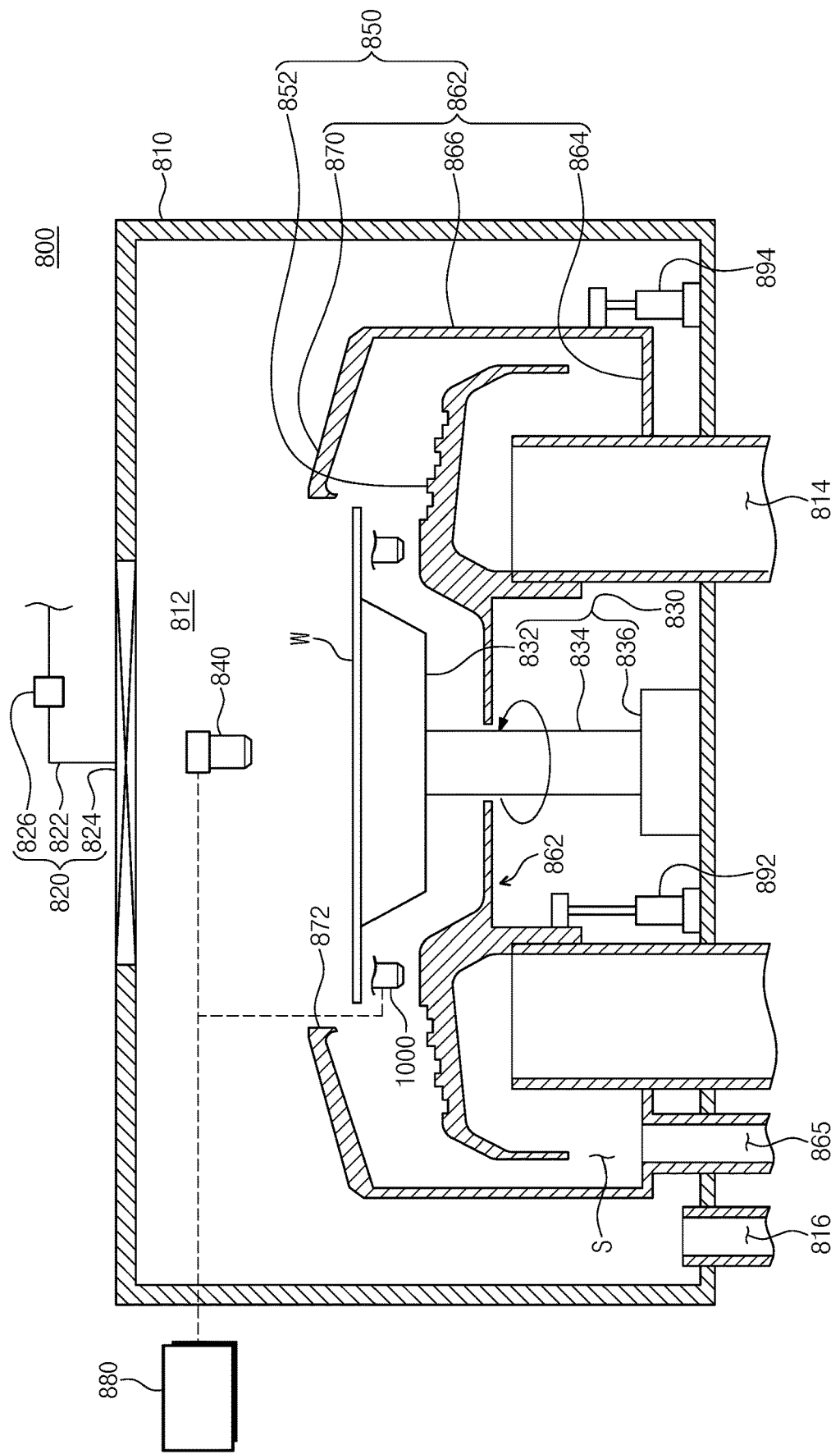
FIG. 6 is a cross sectional view of an embodiment of an apparatus of FIG. 2.
Figure 7:
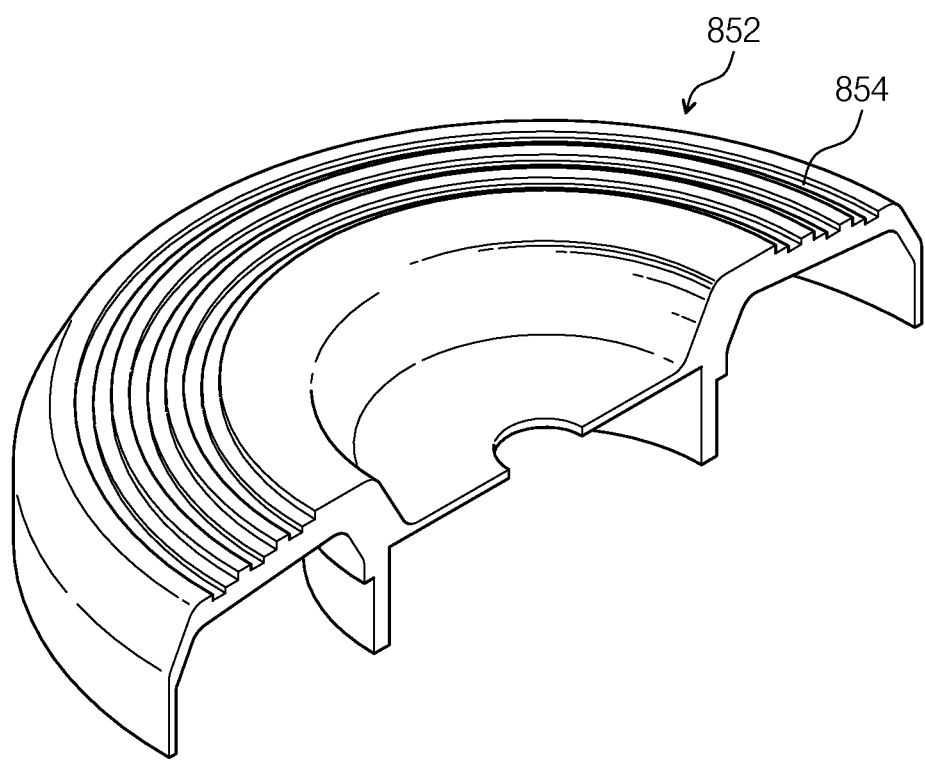
FIG. 7 is a cross sectional view of a guide plate of the apparatus for treating a substrate of FIG. 2.

FIG. 6 is a cross sectional view of an apparatus for treating a substrate of FIG. 2. FIG. 7 is a cross sectional view of a guide plate of FIG. 6. Referring to FIGS. 6 and 7, the apparatus 800 for treating a substrate comprises a housing 810, an airflow supply unit 820, a supporting unit 830, a treatment container 850, an elevator unit 890, a treatment solution supplying unit 840, a cleaning solution supplying unit 1000, and a controller 880.

The housing 810 is provided as a rectangular cylinder shape having an internal space 812. In one end of the housing 310, an opening (not shown) is formed. The opening functions as an entry where the substrate W brings in and out. A door is stalled on the opening and the door opens and closes the opening. The door blocks the opening and seals the internal space 812 of the housing 810 when the substrate treating process is performed. At a bottom side of the housing 810, an inner vent hole 814 and an outer vent hole 816 are formed. An airflow formed within the housing 810 is discharged outside through the inner vent hole 814 and the outer vent hole 816. According to an example, an airflow provided within the treatment container 850 may be discharged through the inner vent hole 814, and an airflow provided outside of the treatment container 850 may be discharged through outer vent hole 816.

The airflow supply unit 820 forms a down flow in inner space of the housing 810. The airflow supply unit 820 includes an airflow supply line 822, a fan 824, and a filter 826. The airflow supply line 822 is connected to the housing 810. The airflow supply line 822 provides outside air in the housing 810. The filter 826 filters an air provided from the airflow supply line 822. The filter 826 removes impurities of the air. The fan 824 is installed on top of the housing 810. The fan 824 is positioned in the center area of the top of the housing 810. The fan 824 forms a down flow in inner space of the housing 810. When air is provided in the fan 824 from the airflow supply line 822, the fan 824 provides air to downward direction.

The supporting unit 830 supports the substrate W inside of the housing 810. The supporting unit 830 rotates the substrate W. The supporting unit 830 includes a spin chuck 832, a rotating shaft 834, and a driver 836. The spin chuck 832 is provided as a substrate supporting member for supporting the substrate. The spin chuck 832 is provided to have a circular plate shape. The substrate W is contacted in an upper surface of the spin chuck 832. The spin chuck 832 is provided to have a smaller diameter than the substrate W. According to an example, the spin chuck 832 may perform chucking the substrate W by vacuum-sucking the substrate W. In another embodiment, the spin chuck 832 may be provided as an electrostatic chuck for chucking the substrate W using electrostatic. Also, the spin chuck 832 may chuck the substrate W with physical strength.

The rotating shaft 834 and the driver 836 is provided as a rotating drive member 834, 836 for rotating the spin chuck 832. The rotating shaft 834 supports the spin chuck 832 under the spin chuck 832. The rotating shaft 834 is provided rotatable along a center of its center shaft. The driver 836 provides a driving power so that the rotating shaft 834 may be rotated. For example, the driver 836 may be a motor that may vary a rotating speed of a rotating shaft.

The treatment container 850 is positioned in the inner space 812 of the housing 810. The treatment container 850 provides a treatment space therein. The treatment container 850 is provided to have a cup shape where an upper surface is open. The treatment container 850 includes a guide plate 852 and a cup 862.

The guide plate 852 is provided with a circular plate shape that surrounds the rotating shaft 834. When viewed from a top side, the guide plate 852 is positioned to be overlapped with the inner vent hole 814. The guide plate 852 may have an inner part and an outer part and the interface therebetween may be right under the lateral end (edge) of the substrate W. For example, the inner vent hole 814 is positioned under and within the outer part of the guide plate 852. An upper surface of the outer part of the guide plate 852 may be curved or rounded. For example the outer part of the guide plate 852 may have an upper surface and a lateral surface, and a treatment solution may flow along the lateral surface of the outer part of the guild plate 852. A exhaust space S is provided under the guide plate 852 near the later surface thereof. A used treatment solution is gathered in the exhaust space S and discharged through a exhaust line 865 which will be explained later.

Figure 8:
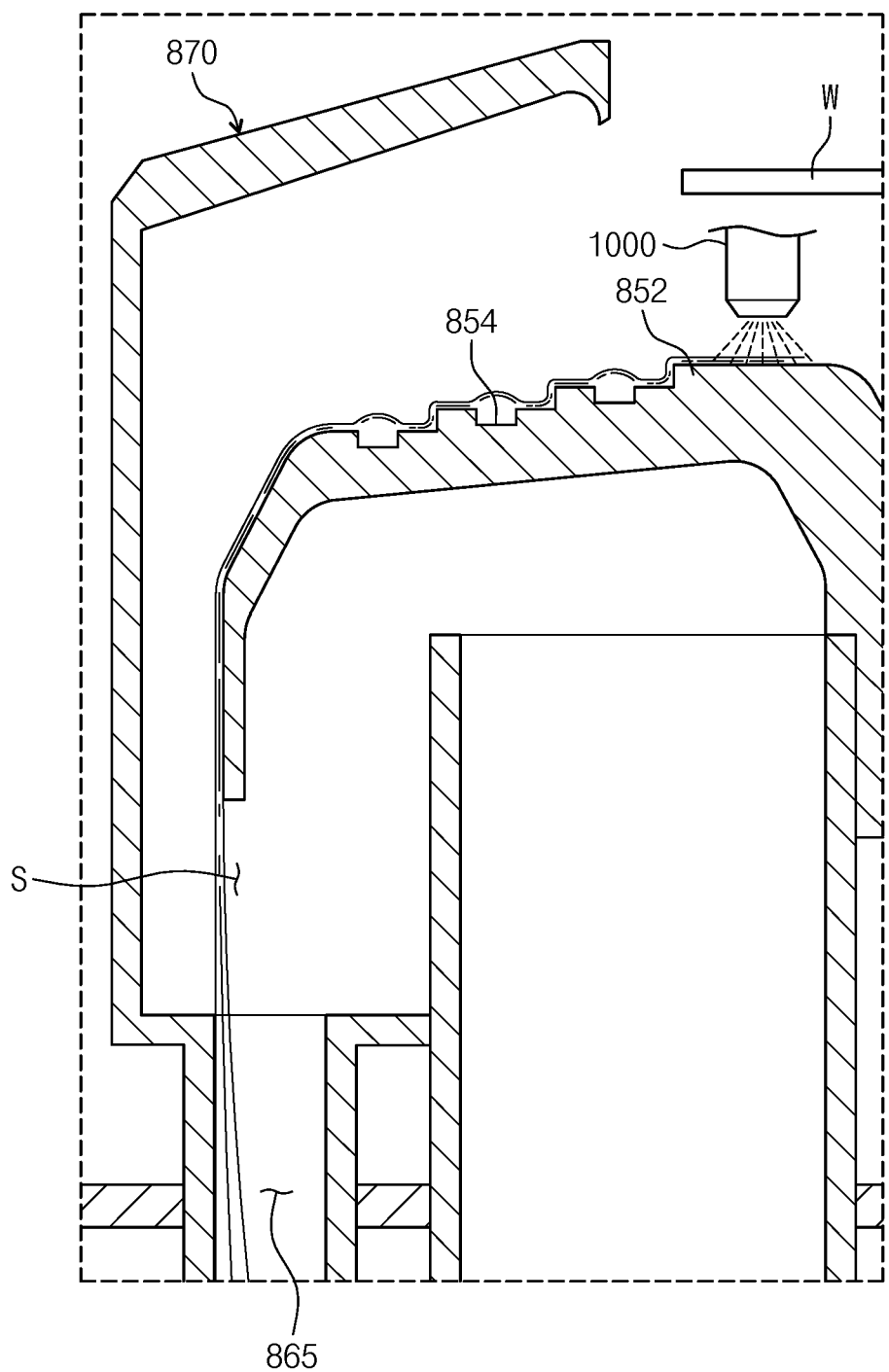
FIG. 8 is a cross sectional view of an upper surface of the guide plate of FIG. 7 in which a cleaning solution flows.

The guide plate 852 is explained by referring to FIGS. 6 to 8.

The guide plate 852 has an outer part (e.g., peripheral portion) having a stair shape descending outwardly. A groove 854 may be provided as a ring shape at a horizontal plane. Also, the groove 854 may be provided with plural numbers of ring shape having concentric with different diameters from each other. The groove 854 may be formed in an upper surface of the guide plate 852. The groove 854 provides a space where a treatment solution may be gathered. The groove 854 may be provided as a ring shape in a slope of the guide plate 852. A plurality of grooves 854 may be provided. For example, a plurality of grooves 854 may be provided with a ring shape having concentric with different diameters from each other.

In the example embodiment described above, the guide plate 852 is provided to have an outer part having a stair shape descending outwardly. However, referring to FIG. 9, the guide plate 1852 may be provided to have an outer part inclined downwardly and outwardly, and the groove 1854 may be provided in an inclined surface (a slope) of the guide plate 1852. Also, a plurality of grooves 1854 may be provided with a ring shape having concentric with different diameters from each other.

The cup 862 is provided with a shape to surround the supporting unit 830 and the guide plate 852. The cup 862 includes a bottom wall 864, a lateral wall 866, a top wall 870, and a sloped wall 870. The bottom wall 864 is provided with a circular plate shape having an opening. The exhaust line 865 is formed in the bottom wall 864. The exhaust line 864 collects a treatment solution provided on the substrate W. The exhaust line 864 is connected to the exhaust space S. A treatment solution used is discharged through the exhaust line 864. A treatment solution collected by the exhaust line 864 may be reused by outside solution reproducing system. The lateral wall 866 is provided with a circular cylinder shape for surrounding the supporting unit 830. The lateral wall 866 is extended vertically from the bottom wall 864. The lateral wall 866 is extended upwardly from the bottom wall 864.

The sloped wall 870 is extended upwardly and inwardly from the lateral wall 866, reaching close to the supporting unit 830. The sloped wall 870 is provided with a ring shape. A top of the sloped wall 870 is positioned higher than the substrate W supported on the supporting unit 830.

The elevator unit 890 elevates the guide plate 852 and the cup 862. The elevator unit 890 includes an inner moving member 892 and an outer moving member 894. The inner moving member 892 elevates the guide plate 852 and the outer moving member 894 elevates the cup 862.

The treatment solution supplying unit 840 supplies a treatment solution on the substrate W. The treatment solution may be a photoresist like a photoresist. The treatment solution supplying unit 840 includes a guide member 846, an arm 848, and a treatment nozzle 844. The guide member 846 includes a guide rail 846 for moving the arm 848 in horizontal direction. The guide rail 846 is positioned in one side of the treatment container. The guide rail 846 is provided such that its lengthwise direction is horizontal direction. According to an example, a lengthwise direction of the guide rail 846 may be provided to be parallel with the first direction. The arm 848 is installed in the guide rail 846. The arm 848 may be moved by a linear motor provided inside of the guide rail 846. When viewed from a top side, the arm 848 is provided such that its lengthwise direction is perpendicular to the guide rail 846. One end of the arm 848 is mounted to the guide rail 846. At the bottom surface of the other end of the arm 848 is provided with the treatment nozzle 844. When viewed from a top side, the treatment nozzle 844 is arranged parallel with a lengthwise direction of the guide rail 846. In another embodiment, the arm 848 may be rotated such that its lengthwise direction is combined to a rotating shaft which has a lengthwise along the third direction.

The treatment nozzle 844 is supplied with a treatment solution from a treatment solution supplying line. A valve is installed in the treatment solution supplying line and opens and closes the treatment solution supplying line.

The cleaning solution supplying unit 1000 provides a cleaning solution to the upper surface of the guide plate 852. The cleaning solution may be a thinner. The cleaning solution supplying unit 1000 may directly discharge the cleaning solution on the upper surface of the guide plate 852.

Figure 11:
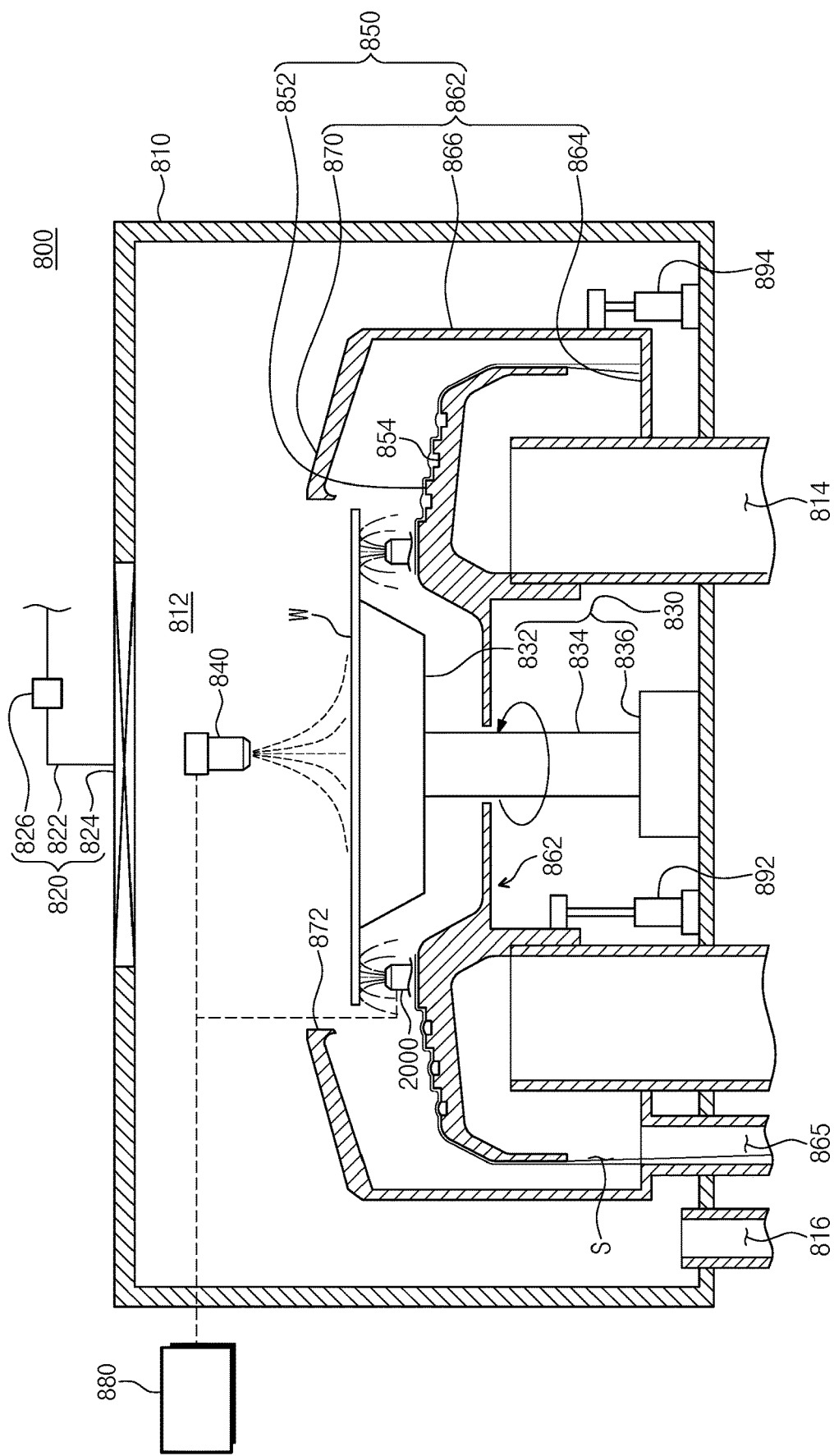
FIG. 11 is a cross sectional view of the other embodiment of the apparatus for treating a substrate of FIG. 3.

Also, different from the above, the cleaning solution supplying unit 2000 may discharge the cleaning solution at the bottom surface of the rotating substrate during a process as described in FIG. 11. This will be explained later.

Also, although it is not shown, the cleaning solution supplying unit 1000 may supply the cleaning solution to a cup. For an example, the cleaning solution supplying unit 1000 may directly supply the cleaning solution at the bottom surface of the cup. Or, the cleaning solution supplying unit 1000 may supply the cleaning solution at an upper surface of the cup. The cleaning solution which is provided may flow to a bottom surface of the cup along a surface of an inner wall of the cup. Therefore, the cup may be cleaned by removing impurities at the bottom surface of the cup.

The controller 880 controls the treatment solution supplying unit and the cleaning solution supplying unit 1000. The controller 880 controls a time when the treatment solution supplying unit and the cleaning solution supplying unit 1000 supply solutions, respectively. For example, the controller 880 makes the cleaning solution supplying unit 1000 to supply the cleaning solution during the time when the treatment solution supplying unit supplies the treatment solution to the substrate. Therefore, when treating the substrate, the guide plate 852 may be cleaned at the same time.

Hereinafter explains a method for cleaning the guide plate 852 using the above described apparatus for treating a substrate.

FIG. 8 shows cleaning a guide plate by the apparatus for treating a substrate FIG. 6. FIG. 8 shows supplying the cleaning solution to the upper surface of the guide plate 852. An outer part of the guide plate 852 is provided with a lower height than an inner part of the guide plate 852. Namely, the guide pate 852 has an outer part having a stair descending outwardly. Therefore, the cleaning solution flows from the upper surface of the guide plate 852 to the outer part of the guide plate 852 and thereby outside of the guide plate 852. While the cleaning solution flows out, some of the cleaning solutions may be gathered in the groove 854. The cleaning solution which is gathered in the groove 854 is used to clean entire area of the upper surface of the guide plate 852. Specifically, the groove 854 is provided with a ring shape at the upper surface of the guide plate 852 and the groove 854 may be provided with plural numbers. The cleaning solution gathered in the groove 854 is overflowed as the further cleaning solution is provided to the guide plate 852. At this time, the cleaning solution gathered in the groove 854 may flow down into many streams with narrow distance therebetween. Therefore, an entire area of the guide plate 852 may be cleaned equally. Also, as the cleaning solution is gathered in the groove 854 and then flows down, some amount of the cleaning solution may be saved.

Figure 9:
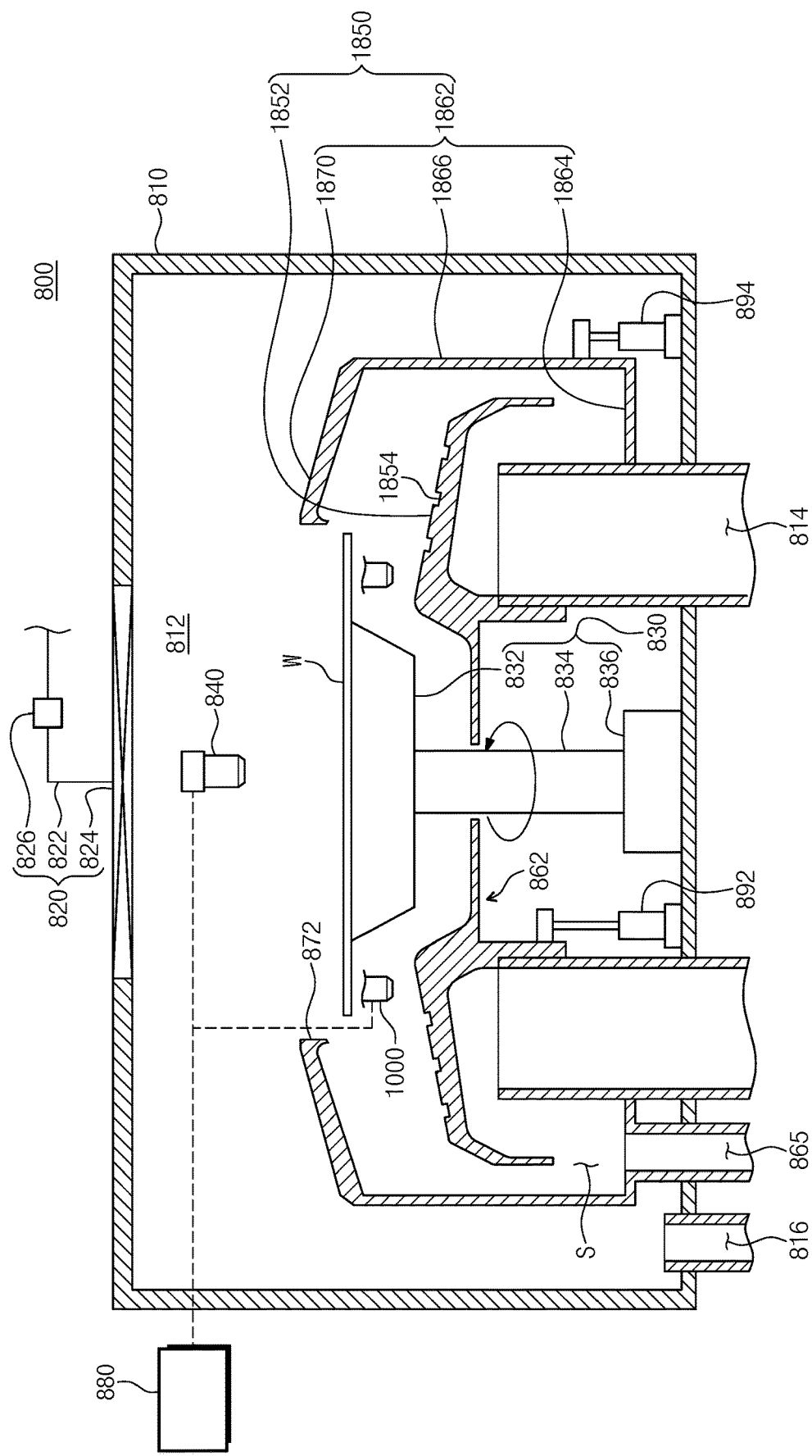
FIG. 9 is a cross sectional view of another embodiment of the apparatus for treating a substrate of FIG. 2.
Figure 10:
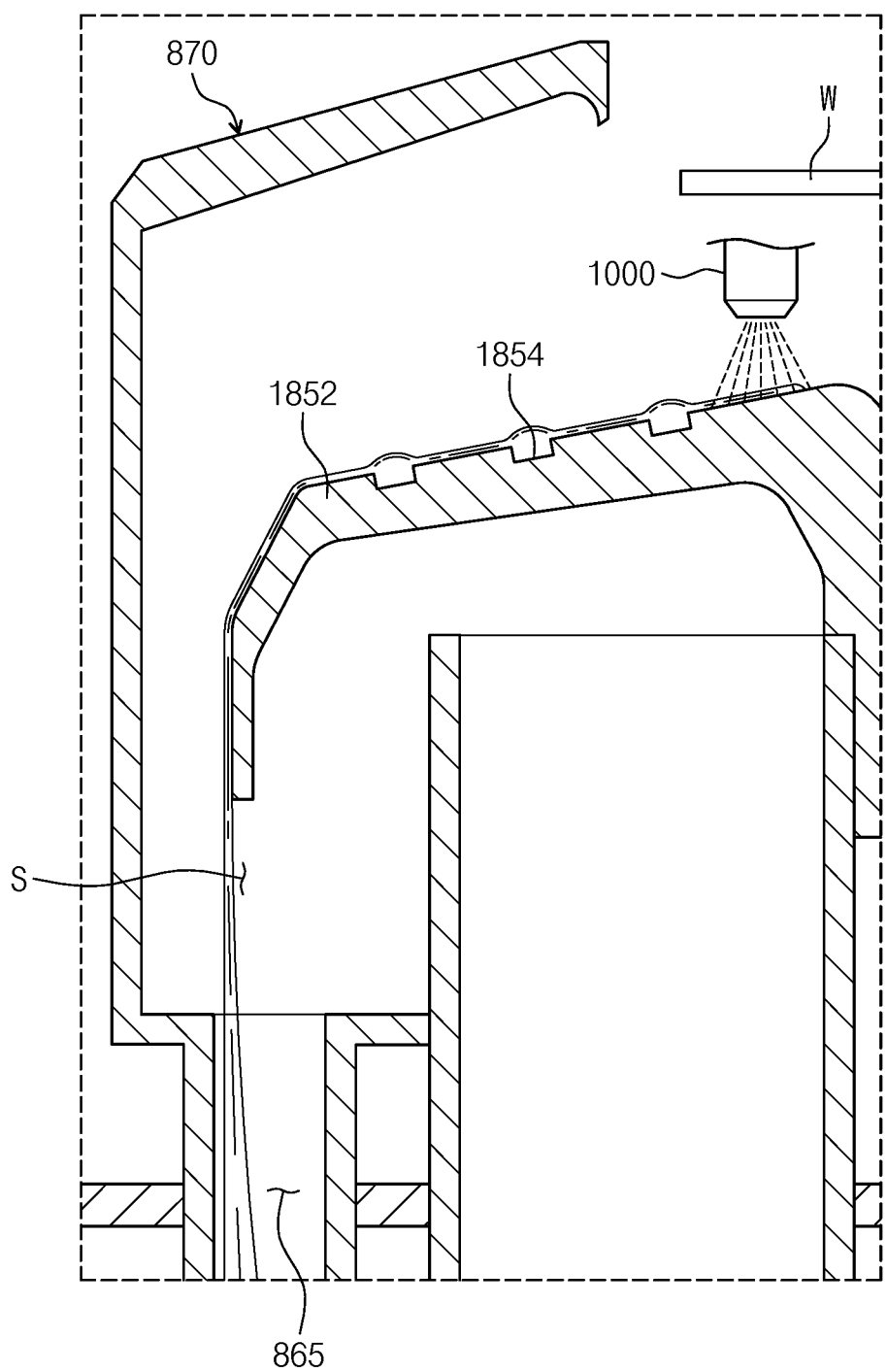
FIG. 10 is a cross sectional view of an upper surface of the guide plate of FIG. 9 in which a cleaning solution flows.

FIGS. 9 and 10 shows cleaning a guide plate in accordance with another embodiment of the present invention. Although a shape of the guide plate 1852 is a little different from the above embodiments, a mechanism that cleans the entire area of the upper surface of the guide plate 1852 by gathering the cleaning solution in the groove 1854 is the same with the above embodiments.

Figure 12:
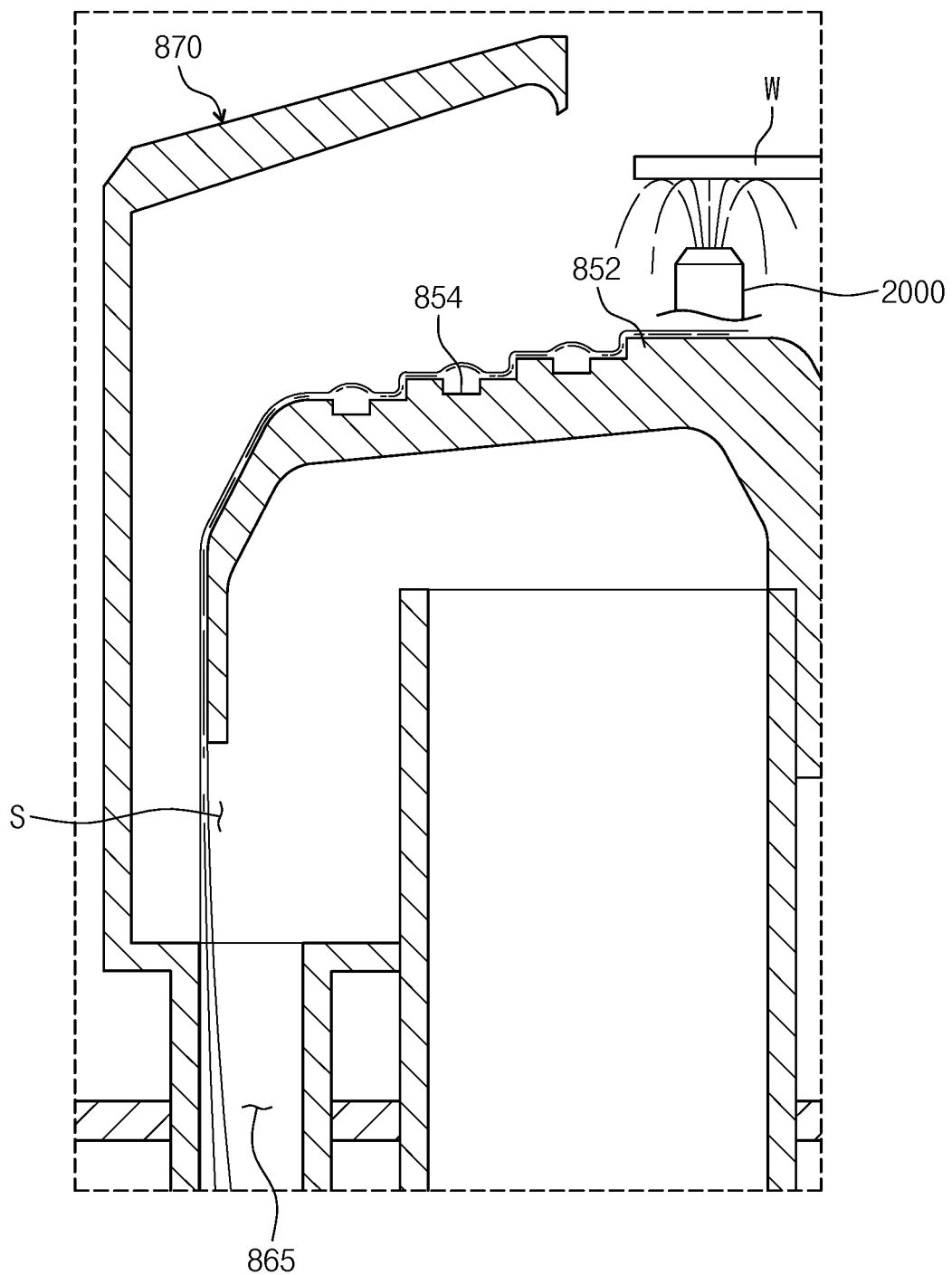
FIG. 12 is a cross sectional view of an upper surface of the guide plate of FIG. 11 in which a cleaning solution flows.

In the above described example embodiments, the cleaning solution is supplied directly to the upper surface of the guide plate 852, but the cleaning solution may be supplied in bottom surface of the rotating substrate. Referring to FIGS. 11 and 12, when supplying the treatment solution to the substrate, the substrate is rotated by rotating the spin chuck 832 to provide the treatment solution to entire area of the substrate. If the treatment solution is supplied to a bottom surface of the rotating substrate, the cleaning solution is supplied from a bottom surface of the guide plate 852 to an upper surface of the guide plate 852 by centrifugal force. Specifically, an upper surface of the supporting unit for supporting the substrate is provided higher than the upper surface of the guide plate 852. Therefore, the cleaning solution is rebounded from a bottom surface of the substrate and re-provided to the upper surface of the guide plate 852. The cleaning solution supplied in the upper surface of the guide plate 852 may clean a top of the guide plate 852 by flowing down as described above.

Referring again to FIGS. 2 to 5, the bake chamber 420 treats the substrate W with heat. For example, the bake chamber 420 performs a prebake process for removing moisture or organic matters from a surface of the substrate W by heating the substrate W with a certain temperature before coating photoresists or soft bake process performed after coating photoresists on the substrate W and performs a cooling process for cooling the substrate W after each of the heating processes. The bake chamber 420 comprises a cooling plate 421 or a heating plate 422. The cooling plate 421 is provided with a cooling system 423 like cooling water or a thermoelectric element. Also, the heating plate 422 is provided with a heating system 424 like a heating wire or a thermoelectric element. The cooling plate 421 and the heating plate 422 may be provided within one bake chamber 420, respectively. In another embodiment, some of the bake chambers 420 may be provided with only cooling plate 421, and some of the bake chambers 420 may be provided with only heating plate 422.

The developing module 402 performs: a developing process that removes a part of photoresist by providing developing solution to obtain a pattern on the substrate W, and a heat treatment process such as heating and cooling the substrate W before and after the developing process. The developing module 402 has a developing chamber 460, a bake chamber 470, and a transfer chamber 480. The developing chamber 460, the bake chamber 470, and the transfer chamber 480 are sequentially arranged along the second direction 14. Therefore, the developing chamber 460 and the bake chamber 470 are positioned separately from each other in the second direction 14 with interposing the transfer chamber 480 there between. A plurality of developing chambers 460 are provided along the first direction 12 and the third direction 16, respectively. In Figs., as an example 6 developing chambers are illustrated. A plurality of bake chambers 470 are provided along the first direction 12 and the third direction 16, respectively. In Figs., as an example, six bake chambers 470 are illustrated. However, more than six bake chambers 470 may be provided.

The transfer chamber 480 is positioned in parallel with or in line with the second buffer 330 of the first buffer module 300 in the first direction 12. Within a transfer chamber 480, a developing unit robot 482 and a guide rail 483 are positioned. Generally the transfer chamber 480 has a rectangular shape. The developing unit robot 482 transfers substrate W between the bake chambers 470, the developing chambers 460, the cooling chamber 350 and the second buffer 330 of the first buffer module 300, and the second cooling chamber 540 of the second buffer module 500. The guide rail 483 is arranged such that its lengthwise direction is parallel with the first direction 12. The guide rail 483 guides the developing unit robot 482 as to move linearly in the first direction 12. The developing unit 482 has a hand 484, arm 485, a supporter 486, and a pedestal 487. The hand 484 is fixedly installed on the arm 485. The arm 485 is provided as an expandable and contractible structure and makes possible for the hand 484 to move in a horizontal direction. The supporter 486 is provided such that its lengthwise direction is parallel with the third direction 16. The arm 485 is movably connected to the supporter 486 such that the arm 485 moves linearly along the supporter 486 in the third direction 16. The supporter 486 is fixedly connected to the pedestal 487. The pedestal 487 is movably connected to the guide rail 283 to move along the guide rail 483.

All the developing chambers 460 may have the same structure. Only kinds of developing solutions used in each developing chamber 460 may be different from each other. The developing chamber 460 performs a developing process that may remove photoresist from the area of the substrate W to which a light is irradiated. At this time, a protection layer formed in an area where to which a light is irradiated may be also removed. Depending on a type of photoresist, photoresist and protection layer formed in an area to which a light is not irradiated may be removed.

The developing chamber 460 has a container 461, a supporting plate 462, and a nozzle 463. The container 461 has a cup shape whose upper side is open. The supporting plate 462 is placed within the housing 461, and supports the substrate W. The supporting plate 462 is provided rotatable. The nozzle 463 provides developing solution on the substrate W supported on the supporting plate 462. The nozzle 463 has a circular tube shape, and may provide developing solution to a center of the substrate W. The nozzle 463 may have a length corresponding to a diameter of the substrate W, and discharge port of the nozzle 463 may be provided as a slit. Also, the developing chamber 460 may be further provided with a nozzle 464 that provides cleaning solution such as deionized water to clean the surface of substrate W to which developing solution has been provided.

The bake chamber 470 treats the substrate W with heat. For example, the bake chambers 470 perform post-bake process which heats the substrate W before developing process, a hard-bake process which heats the substrate W after performing post bake process, and a cooling process which cools heated substrate W after each bake process. The bake chamber 470 has a cooling plate 471 or a heating plate 472. In cooling plate 471, cooling water or cooling system 473 such as thermoelectric element is provided. Or in a heating plate 472, a heating wire or a heating system 474 such as thermoelectric element is provided. The cooling plate 471 and the heating plate 472 may be provided within one bake chamber 470, respectively. Optionally, some of the bake chambers 470 is provided with only cooling plate 471, and some of the bake chambers 470 may be provided with only heating plate 472.

In coating and developing module 400, coating module 401 and the developing module 402 are provided as to be separated from each other as described above. Also, from a top view the coating module 401 and developing module 402 may have the same chamber arrangement.

The second buffer module 500 is provided as a passageway where the substrate W is carried between the coating and developing module 400 and the pre/post exposure treating module 600. Also, the second buffer module 500 performs a process such as cooling process or an edge exposure process to the substrate W. The second buffer module 500 includes a frame 510, a buffer 520, a first cooling chamber 530, a second cooling chamber 540, an edge exposure chamber 550, and a second buffer robot 560. The frame 510 is provided as a rectangular shape. The buffer 520, the first cooling chamber 530, the second cooling chamber 540, the edge exposure chamber 550, and the second buffer robot 560 are placed within the frame 510. The buffer 520, the first cooling chamber 530, and the second buffer robot 560 are located at a height corresponding to a height of the coating module 501. The second cooling chamber 540 is located at a height corresponding to a height of the developing module 402. The buffer 520, the first cooling chamber 530, and the second cooling chamber 540 are sequentially arranged in a line along the third direction 16. When viewed from a top side, the buffer 520 and the transfer chamber 430 of the coating module 401 are arranged along the first direction 12. The edge exposure chamber 550 is separately positioned with the buffer 520 or the first cooling chamber 530 along the second direction 14 with a certain distance.

The second buffer robot 560 transfers substrate W between the buffer 320, the first cooling chamber 530, and the edge exposure chamber 550. The second buffer robot 560 is positioned between the edge exposure chamber 550 and the buffer 520. The second buffer robot 560 may be provided with a similar structure with the first buffer robot 360. The first cooling chamber 530 and the edge exposure chamber 550 perform a subsequent process to the substrates W where a process has been performed in the coating module 401. The first cooling chamber 530 cools the substrate W on which a process is performed in the coating module 401. The first cooling chamber 530 has similar structure with the cooling chamber 350 of the first buffer module 300. The edge exposure chamber 550 exposes an end of the substrate W on which the cooling process has been performed in the first cooling chamber 530. The buffer 520 temporarily keeps that substrate W before the substrates W on which a process is performed in the edge exposure chamber 550 are carried to a pre-treating module 601 which will be described later. The second cooling chamber 540 cools substrates W before the substrates W on which a process is performed in a post-treating module 602 which will be described later are carried to the developing module 402. The second buffer module 500 may further comprise an additional buffer at a height corresponding to the developing module 402. In this case, the substrate W processed in the post-treating module 602 may temporarily kept in the additional buffer and carried to the developing module 402.

When an exposure device 900 performs an immersion exposure process, the pre/post exposure treatment module 600 may treat a process for coating a protection layer which protects a photoresist layer coated on the substrate W. Also, the pre/post exposure treatment module 600 may clean the substrate W after exposure. Also, after coating process by using chemical amplification resist, the pre/post exposure treatment module 600 may treat a bake process after exposure.

The pre/post exposure treatment module 600 includes a pre-treating module 601 and a post-treating module 602. The pre-treating module 601 treats the substrate W before exposure process and the post-treating module 602 treats the substrate W after exposure process. The pre-treatment module 601 and the post-treating module 602 arranged to divide each other as layer. According to an example, the pre-treating module 401 is positioned on top of the post-treating module 402. The pre-treating module 401 is provided with the same height to the coating module 401. The post-treating module 402 is provided with the same height to the developing module 402. The pre-treating module 401 includes a protection layer coating chamber 610, a bake chamber 620, and a transfer chamber 630. The protection layer coating chamber 610, the transfer chamber 620, and the bake chamber 620 are sequentially arranged along the second direction 14. Therefore, the protection layer coating chamber 610 and the bake chamber 620 are positioned separately each other along the second direction 14 with interposing the transfer chamber 630 there between. A plurality of the protection layer coating chambers 610 are provided along the third direction 16. In another embodiment, a plurality of the protection layer coating chambers 610 is provided along the first direction 12 and the third direction 16, respectively. A plurality of the bake chambers 620 is provided along the third direction 16. In another embodiment, a plurality of the bake chambers 620 are provided along the first direction 12 and the third direction 16, respectively.

The transfer chamber 630 is positioned in parallel or in line with with the first cooling chamber 530 of the second buffer module 500 in the first direction 12. Within a transfer chamber 630, a pre-treating robot 632 is positioned. Generally the transfer chamber 630 has a rectangular shape. The pre-treating robot 632 transfers substrate W between the protection layer coating chamber 610, the bake chambers 620, the buffer 520 of the second buffer module 500, and first buffer 720 of an interface module 700 which will be described later. The pre-treating robot 632 includes a hand 633, an arm 634, and a supporter 635. The hand 633 is fixedly installed on the arm 634. The arm 634 is provided as an expandable and contractible structure and rotatable. The arm 634 is movably connected to the supporter 635 such that the arm 634 moves linearly along the supporter 635 in the third direction 16.

The protection layer coating chamber 610 coats a protection layer for protecting a resist layer on the substrate W when immersion exposure is processed. The protection layer coating chamber 610 includes a housing 611, a supporting plate 612, and a nozzle 613. The housing 611 has a cup shape whose upper side is open. The supporting plate 612 is placed within the housing 611, and supports the substrate W. The supporting plate 612 is provided rotatable. The nozzle 613 provides protection solution for forming a protection layer on the substrate W supported on the supporting plate 612. The nozzle 613 has a circular tube shape, and may provide protection solution to a center of the substrate W. In another embodiment, the nozzle 613 may have a length corresponding to a diameter of the substrate W, and discharge port of the nozzle 613 may be provided as a slit. In this case, the supporting plate 612 may be provided as fixed state. The protection solution includes an expandable material. The protection solution may be used with a photoresist and a material having low affinity with water. For example, the protection solution may include a fluorocarbon-based solvent. The protection layer coating chamber 610 provides the protection solution to a center of the substrate W by rotating the substrate placed on the supporting plate 612.

The bake chamber 620 treats the substrate W coated with the protection layer with heat. The bake chamber 620 has a cooling plate 621 or a heating plate 622. In cooling plate 621, cooling water or cooling system 623 such as thermoelectric element is provided. Or in a heating plate 622, a heating wire or a heating system 624 such as thermoelectric element is provided. The cooling plate 621 and the heating plate 622 may be provided within one bake chamber 620, respectively. Optionally, some of the bake chambers 620 may be provided with only cooling plate 621, and some of the bake chambers 620 may be provided with only heating plate 622.

The post-treating module 602 has a cleaning chamber 660, an after exposure bake chamber 670, and a transfer chamber 680. The cleaning chamber 660, the exposure bake chamber 670, and the transfer chamber 680 are sequentially arranged along the second direction 14. Therefore, the cleaning chamber 660 and after exposure bake chamber 670 are positioned separately each other along the second direction 14 with interposing the transfer chamber 680 there between. A plurality of the cleaning chambers 660 may be provided along the third direction 16. A plurality of the cleaning chambers 660 are provided along the first direction 12 and the third direction 16, respectively. A plurality of the after exposure bake chambers 670 may be arranged along the third direction 16. In another embodiment, a plurality of after exposure bake chambers 670 may be provided along the first direction 12 and the third direction 16, respectively.

The transfer chamber 680 is positioned in parallel with or in line with the second cooling chamber 540 of the second buffer module 500 in the first direction 12, when viewed from a top side. Generally the transfer chamber 680 has a rectangular shape. Within a transfer chamber 680, a post treating robot 682 is positioned. The post treating robot 682 carries the substrate W between the after exposure bake chamber 670, the second cooling chamber 540 of the second buffer module 500, and second buffer 730 of an interface module 700 which will be described later. The post treating robot 862 provided in the post-treating module 602 may be provided with the same structure with the pretreating robot 632 provided in the pre-treating module 601.

The cleaning chamber 660 cleans the substrate W after exposure process. The cleaning chamber 660 includes a housing 661, a supporting plate 662, and a nozzle 663. The housing 661 has a cup shape whose upper side is open. The supporting plate 662 is placed within the housing 661, and supports the substrate W. The supporting plate 662 is provided rotatable. The nozzle 663 provides cleaning on the substrate W supported on the supporting plate 662. Deionized water may be used as the cleaning solution. The cleaning chamber 660 provides the cleaning solution to a center of the substrate W by rotating the substrate W placed on the supporting plate 662. Selectively, the nozzle 663 may linearly move or rotate from the center of the substrate to an edge of the substrate W when the substrate W is rotating.

The after exposure bake chamber 670 heats the substrate W on which the exposure process has been performed by using far-ultraviolet. The after exposure bake chamber heats the substrate W and amplifies an acid formed in a photoresist by an exposure and thereby completes changing property of the photoresist. The after exposure bake chamber 670 has a heating plate 672. In the heating plate 672 a heating wire or a heating system 674 such as thermoelectric element is provided. The after exposure bake chamber 670 may further be provided with a cooling plate 671 therein. In the cooling plate 671, cooling water or cooling system 673 such as thermoelectric element is provided. Also, in another embodiment a bake chamber only provided with the cooling chamber 671 may further be provided.

As described above, the pre-treating module 601 and the post-treating module 602 may be provided completely separated from each other in the pre/post exposure treatment module 600. Also, the transfer chamber 630 of the pre-treating module 601 and the transfer chamber 680 of the post-treating module 602 are provided with the same size structures and thereby may be completely overlapped with each other when viewed from a top side. Also, the protection layer coating chamber 610 and the cleaning chamber 660 are provided with the same size structures and thereby may be completely overlapped with each other when viewed from a top side. Also, the bake chamber 620 and the after exposure bake chamber 670 are provided with the same size structures and thereby may be completely overlapped with each other when viewed from a top side.

The interface module 700 transfers the substrate W between the pre/post exposure treatment module 600 and the exposure device 900. The interface module 700 has a frame 710, a first buffer 720, a second buffer 730, and an interface robot 740. The first buffer 720, the second buffer 730, and the interface robot 740 are placed within the frame 710. The first buffer 720 and the second buffer 730 are spaced apart from each other by a certain distance, and are arranged to stack each other. The first buffer 720 is arranged higher than the second buffer 730. The first buffer 720 is placed at a height corresponding to a height of the pre-treating module 601. The second buffer 730 is placed at a height corresponding to a height of the post-treating module 602. When viewed from a top side, the first buffer 720 is arranged in a row with the transfer chamber 630 of the pre-treating module 601 along the first direction 12. The second buffer 730 is arranged in a row with the transfer chamber 630 of the post-treating module 602 along the first direction 12.

The interface robot 740 is spaced apart from the first buffer 720 and the second buffer 730 along the second direction 14. The interface robot 740 carries the substrate W between the first buffer 720, the second buffer 730, and the exposure device 900. Generally the interface robot 740 has a similar structure with the second buffer robot 560.

The first buffer 720 temporarily keeps substrates W, to which some processes have been performed, before moving to the exposure device 900. And then the second buffer 730 temporarily keeps the substrates W, to which some processes have been already performed in the exposure device 900, before they get moved to the post-treating module 602. The first buffer 720 has a housing 721 and a plurality of supporters 722. The supporters 722 are arranged within the housing 721, and spaced apart from each other along the third direction 16. In each supporter 722, a single substrate W is placed. The housing 721 has an opening (not shown) on the direction where the interface robot 740 is provided and on the direction where the pretreating robot 632 is provided, for the interface robot 740 and pretreating robot 632 to bring or take the substrate W in or out of the supporter 722 within the housing 721. The second buffer 730 has similar structure to the first buffer 720. However, a housing 4531 of the second buffer 730 does not have an opening (not shown) on the direction where the interface robot 740 is provided and on the direction where the post treating robot 682 is provided. In the interface module, as described above only buffers and robot may be provided without chamber which performs a certain process for the substrate.

Foregoing embodiments are examples of the present invention. Further, the above contents merely illustrate and describe preferred embodiments and embodiments may include various combinations, changes, and environments. That is, it will be appreciated by those skilled in the art that substitutions, modifications and changes may be made in these embodiments without departing from the principles and spirit, the scope of which is defined in the appended claims and their equivalents. Further, it is not intended that the scope of this application be limited to these specific embodiments or to their specific features or benefits. Rather, it is intended that the scope of this application be limited solely to the claims which now follow and to their equivalents.

What is claimed is:

1. An apparatus for treating a substrate comprising:
   a cup having an inner space with a top being open;
   a supporting unit for supporting a substrate in the inner space;
   a guide plate configured to surround the supporting unit;
   a treatment solution supplying unit for supplying a treatment solution to an upper surface of the substrate supported by the supporting unit; and
   a cleaning solution supplying unit for supplying a cleaning solution to an upper surface of the guide plate,
   wherein the upper surface of the guide plate forms a plurality of steps, and
   wherein the cleaning solution remains in the plurality of steps.

2. The apparatus of claim 1, wherein the plurality of steps is capable of trapping the cleaning solution.

3. The apparatus of claim 1, wherein the guide plate is configured to have an outer part inclined downwardly and outwardly.

4. The apparatus of claim 1, wherein the plurality of steps is provided with a ring shape at an inclined portion of the guide plate.

5. The apparatus of claim 1, wherein the guide plate is configured to have an outer part descending outwardly.

6. The apparatus of claim 5, wherein the plurality of steps is provided as a ring shape at a horizontal plane of the guide plate.

7. The apparatus of claim 4, wherein the plurality of steps is concentric with each other with different diameters from each other.

8. The apparatus of claim 1, wherein the cup is provided with an exhaust space of the cleaning solution and the treating solution under the guide plate and at a position corresponding to an end of the guide plate, and an exhaust line is connected to the exhaust space.

9. The apparatus of claim 1, further comprising a controller configured to control the treatment solution supplying unit and the cleaning solution supplying unit,
   wherein the controller controls the treatment solution supplying unit and the cleaning solution supplying unit so that the cleaning solution is supplied when the treatment solution is supplied.

10. The apparatus of claim 1, wherein the treatment solution is a photoresist and the cleaning solution is a thinner.

11. The apparatus of claim 1, wherein the cleaning solution supplying unit supplies a cleaning solution directly to the upper surface of the guide plate.

12. The apparatus of claim 1, wherein the cleaning solution supplying unit provides a cleaning solution to a bottom surface of the substrate, and an upper surface of the substrate is higher than an upper surface of the guide plate so that the cleaning solution flows to the upper surface of the guide plate by centrifugal force when the substrate rotates.

13. The apparatus of claim 1, wherein the plurality of steps includes up-steps and down-steps.

14. The apparatus of claim 13, wherein a number of up-steps is less than a number of down-steps.

* * * * *